(12) United States Patent
Lee et al.

(10) Patent No.: US 9,183,931 B2
(45) Date of Patent: Nov. 10, 2015

(54) RESISTIVE MEMORY DEVICE CAPABLE OF INCREASING SENSING MARGIN BY CONTROLLING INTERFACE STATES OF CELL TRANSISTORS

(71) Applicants: Jae-Kyu Lee, Yongin-si (KR); Dae-Won Kim, Seoul (KR)

(72) Inventors: Jae-Kyu Lee, Yongin-si (KR); Dae-Won Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/337,313

(22) Filed: Jul. 22, 2014

(65) Prior Publication Data

US 2015/0155037 A1   Jun. 4, 2015

(30) Foreign Application Priority Data

Dec. 3, 2013   (KR) .......................... 10-2013-0149391

(51) Int. Cl.
| | |
|---|---|
| *G11C 11/00* | (2006.01) |
| *G11C 11/14* | (2006.01) |
| *G11C 11/15* | (2006.01) |
| *G11C 13/00* | (2006.01) |
| *G11C 11/16* | (2006.01) |

(52) U.S. Cl.
CPC ........ *G11C 13/0069* (2013.01); *G11C 11/1659* (2013.01); *G11C 11/1675* (2013.01); *G11C 13/003* (2013.01); *G11C 11/1677* (2013.01); *G11C 13/0004* (2013.01); *G11C 13/0007* (2013.01); *G11C 13/0064* (2013.01); *G11C 2213/76* (2013.01); *G11C 2213/79* (2013.01)

(58) Field of Classification Search
USPC .......................... 365/148, 158, 163, 171, 173
See application file for complete search history.

(56) References Cited

U.S. PATENT DOCUMENTS

| | | | |
|---|---|---|---|
| 6,480,438 B1 | 11/2002 | Park | |
| 7,453,747 B2 | 11/2008 | Abraham et al. | |
| 7,633,809 B2 | 12/2009 | Kajiyama | |
| 7,851,777 B2* | 12/2010 | Arai et al. | 365/163 |
| 8,040,723 B2 | 10/2011 | Sheu et al. | |
| 8,199,562 B2 | 6/2012 | Zhu et al. | |
| 8,355,274 B2* | 1/2013 | Arita et al. | 365/148 |
| 8,445,886 B2* | 5/2013 | Fujii et al. | 365/163 |
| 8,542,520 B2* | 9/2013 | Hirose | 365/148 |
| 8,654,595 B2 | 2/2014 | Kim et al. | |
| 8,830,728 B2* | 9/2014 | Lee et al. | 365/148 |

FOREIGN PATENT DOCUMENTS

| | | |
|---|---|---|
| JP | 2007-141399 | 6/2007 |
| KR | 1020040006335 A | 1/2004 |
| KR | 1020130027840 A | 3/2013 |

* cited by examiner

*Primary Examiner* — Trong Phan
(74) *Attorney, Agent, or Firm* — Myers Bigel Sibley & Sajovec, PA

(57) ABSTRACT

Memory systems can include a memory device having an array of nonvolatile memory cells therein, which is electrically coupled to a plurality of bit lines and a plurality of word lines. The nonvolatile memory cells may include respective nonvolatile resistive devices electrically coupled in series with corresponding cell transistors. A controller is also provided, which may be coupled to the memory device. The controller can be configured to drive the memory device with signals that support dual programming of: (i) the nonvolatile resistive devices; and (ii) interface states within the cell transistors, during operations to write data into the memory device.

20 Claims, 14 Drawing Sheets

RESISTIVE MEMORY DEVICE CAPABLE OF INCREASING SENSING MARGIN BY CONTROLLING INTERFACE STATES OF CELL TRANSISTORS

REFERENCE TO PRIORITY APPLICATION

This application claims priority under 35 U.S.C. §119 to Korean Patent Application No. 10-2013-0149391 filed on Dec. 3, 2013, the disclosure of which is hereby incorporated herein by reference in its entirety.

BACKGROUND

1. Field

Embodiments of the inventive concept relate to semiconductor memory devices and, more particularly, to resistive memory devices.

2. Description of Related Art

Semiconductor memory devices, which are used to store data, may be classified into volatile semiconductor memory devices and nonvolatile semiconductor memory devices. A volatile semiconductor memory device may store data through charge or discharge of a capacitor, for example. A volatile semiconductor memory device, such as a random access memory (RAM), may store or read data when power supply is applied and lose data when power supply is interrupted. The volatile semiconductor memory device may be mainly used as a main memory device of a computer.

A nonvolatile semiconductor memory device may store data even if power supply is interrupted. The nonvolatile semiconductor memory device may be used to store programs and data for a wide range of applications, such as computers and portable communication devices.

Owing to the demand for fabrication of high-capacity low-power semiconductor memory devices, research has been conducted on advanced nonvolatile memory devices that do not require refresh operations. Currently, phase-change RAMs (PRAMs) using phase-change materials, resistive RAMs (RRAMs) using variable resistive materials, such as transition metal oxides, and magnetic RAMs (MRAMs) using ferromagnetic materials have attracted considerable attention as advanced memory devices. All of the advanced memory devices may have variable resistances according to applied currents or voltages and may not need refresh operations due to nonvolatile characteristics so that even if the currents or voltages are no longer applied, the advanced memory devices can retain the resistance value as it is.

SUMMARY

Memory systems according to embodiments of the invention can include a memory device having an array of nonvolatile memory cells therein, which is electrically coupled to a plurality of bit lines and a plurality of word lines. The nonvolatile memory cells may include respective nonvolatile resistive devices electrically coupled in series with corresponding cell transistors. A controller is also provided, which may be coupled to the memory device. The controller can be configured to drive the memory device with signals that support dual programming of the nonvolatile resistive devices and interface states within the cell transistors, during operations to write data into the memory device.

According to some of these embodiments of the invention, the operations to write data into the memory device may include writing equivalent data into first and second nonvolatile memory cells by programming first and second cell transistors within the first and second nonvolatile memory cells, respectively, with unequal levels of interface states. In particular, the operations to write equivalent data into first and second nonvolatile memory cells can include programming first and second nonvolatile resistive devices within the first and second nonvolatile memory cells, respectively, in advance of the operations to program the first and second cell transistors with unequal levels of interface states. The operations to program the first and second nonvolatile resistive devices can also be followed by operations to determine whether the first and second nonvolatile resistive devices have been programmed to equivalent target values. Moreover, in the event the first and second cell transistors are MOS transistors, then they may be programmed with unequal levels of interface states via at least one of hot-carrier injection and Fowler-Nordheim (F-N) tunneling.

According to still further embodiments of the invention, methods of programming a nonvolatile memory device may include programming first and second nonvolatile memory elements within first and second nonvolatile memory cells, respectively, with equivalent data, and then reading data from the first and second nonvolatile memory cells to verify whether the first and second nonvolatile memory elements have been programmed to equivalent target values. Thereafter, first and second cell transistors within the first and second nonvolatile memory cells, respectively, may be programmed with unequal levels of interface states. In particular, the programming of the first and second cell transistors can be performed in response to determining that the first and second nonvolatile memory elements have been programmed to unequal target values. According to further embodiments of the invention, the programming of the first and second cell transistors can include programming the first and second cell transistors so that a combined series resistance of the first nonvolatile memory element and the first cell transistor is about equal to a combined series resistance of the second nonvolatile memory element and the second cell transistor. In this manner, the unequal series resistance values provided by the first and second cell transistors may be used to compensate for the fact that the series resistances provided by the first and second nonvolatile memory elements are unequal, notwithstanding the fact that the first and second nonvolatile memory cells were to be programmed with equivalent data during write operations.

Additional embodiments of the inventive concept provide a resistive memory device capable of compensating resistance distribution and increasing sensing margin of data and a method of compensating resistance distribution of a resistive memory device capable of compensating resistance distribution and increasing sensing margin of data. In accordance with an aspect of the inventive concept, a resistive memory device may include a memory cell array and an input/output (I/O) sense amplifier.

The memory cell array includes a plurality of unit memory cells. The memory cell array operates in response to a word line driving signal and a column selecting signal. Each of the unit memory cells includes a resistive device and a cell transistor connected in series. The I/O sense amplifier senses and amplifies data output from the memory cell array to output the amplified data, generates a program current based on input data received from an exterior, and provides the program current to the memory cell array. The resistive memory device reads out output data of the I/O sense amplifier, and adjusts interface states of cell transistors included in the memory cell array based on a voltage level of the output data in a test mode.

In an embodiment, resistance distributions of the resistive device and a parasitic resistor may be compensated by resistance distribution of the cell transistor.

In an embodiment, resistance values of the cell transistors may be changed by adjusting interface states of the cell transistors.

In an embodiment, the interface states may be generated because of stress-related degradation by Fowler-Nordheim (F-N) tunneling.

In an embodiment, a high voltage may be applied to each gate terminal of the cell transistors, and a ground voltage may be applied to each source terminal and each drain terminal of the cell transistors.

In an embodiment, the interface states may be generated by hot-carrier injection.

In an embodiment, a first high voltage may be applied to each gate terminal of the cell transistors, a ground voltage may be applied to each source terminal of the cell transistors, and a second high voltage may be applied to each drain terminal of the cell transistors. The second high voltage may have a higher voltage than the first high voltage.

In an embodiment, a first high voltage may be applied to each gate terminal of the cell transistors, a ground voltage may be applied to each drain terminal of the cell transistors, and a second high voltage may be applied to each source terminal of the cell transistors. The second high voltage may have a higher voltage than the first high voltage.

In an embodiment, the resistive memory device may further include an address input buffer, a row decoder and a column decoder.

The address input buffer generates a row address signal and a column address signal based on an external address. The row decoder decodes the row address signal and generates the word line driving signal based on the decoded row address signal. The column decoder decodes the column address signal and generates the column selecting signal based on the decoded column address signal.

In accordance with another aspect of the inventive concept, a resistive memory device may include a memory cell array, an address input buffer, a row decoder, a column decoder, and an input/output (I/O) sense amplifier.

The memory cell array includes a plurality of unit memory cells, and operates in response to a word line driving signal and a column selecting signal. Each of the unit memory cells includes a resistive device and a cell transistor connected in series. The address input buffer generates a row address signal and a column address signal based on an external address. The row decoder decodes the row address signal and generates the word line driving signal based on the decoded row address signal. The column decoder decodes the column address signal and generates the column selecting signal based on the decoded column address signal. The I/O sense amplifier senses and amplifies data output from the memory cell array to output the amplified data, generates a program current based on input data received from an exterior, and provides the program current to the memory cell array. The memory device reads out output data of the I/O sense amplifier, and adjusts interface states of cell transistors included in the memory cell array based on a voltage level of the output data in a test mode.

In an embodiment, each of the unit memory cells may include a cell transistor having a gate connected to a word line, and the resistive device connected between a drain of the cell transistor and a bit line.

In an embodiment, the I/O sense amplifier may include a selection circuit, a sense amplifier, a verifying circuit, a program driver and a write driver.

The selection circuit selectively connects the bit lines to a first node in response to the column selecting signal. The sense amplifier amplifies a difference between a voltage signal of the first node and a reference voltage to generate first data. The verifying circuit compares the first data with a target value, and determines whether the first data equals to the target value to generate a first control signal in the test mode. The program driver drives a high voltage circuit based on the first control signal to generate a word line control signal and a bit line control signal. The write driver generates a first program current based on write data, provides the program current to the first node in a normal operating mode, generates a second program current based on the bit-line control signal, and provides the second program current to the first node in the test mode.

In an embodiment, the row decoder may change a voltage level of the a word line driving signal based on the word line control signal in the test mode.

In an embodiment, the I/O sense amplifier may further include a switch configured to selectively connect the first node to the sense amplifier and the write driver.

In an embodiment, a magnitude of the second program current may be changed according to a voltage level of the first control signal.

In an embodiment, the resistive memory device may further include an input/output (I/O) circuit configured to determine an output order of the first data and perform a parallel-serial conversion to generate output data, and configured to buffer the input data to provide the buffered data to the I/O sense amplifier.

In accordance with still another aspect of the inventive concept, a method of compensating resistance distribution of a resistive memory device including a plurality of resistive devices and a plurality of cell transistors connected to each of the resistors in series may include writing data of "0" or "1" with respect to all the memory cells included in a memory cell array; selecting a memory cell from which data is read out; reading out data from the selected memory cell; determining whether the read data equals to a target value; ending a process when the data is equal to the target value, and adjusting an interface states of cell transistors when the data is not equal to the target value.

In an embodiment, the adjusting of the interface states of cell transistors may include driving a program driver, selecting a memory cell for which interface state is to be adjusted, and giving stress with respect to a cell transistor of the selected memory cell.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
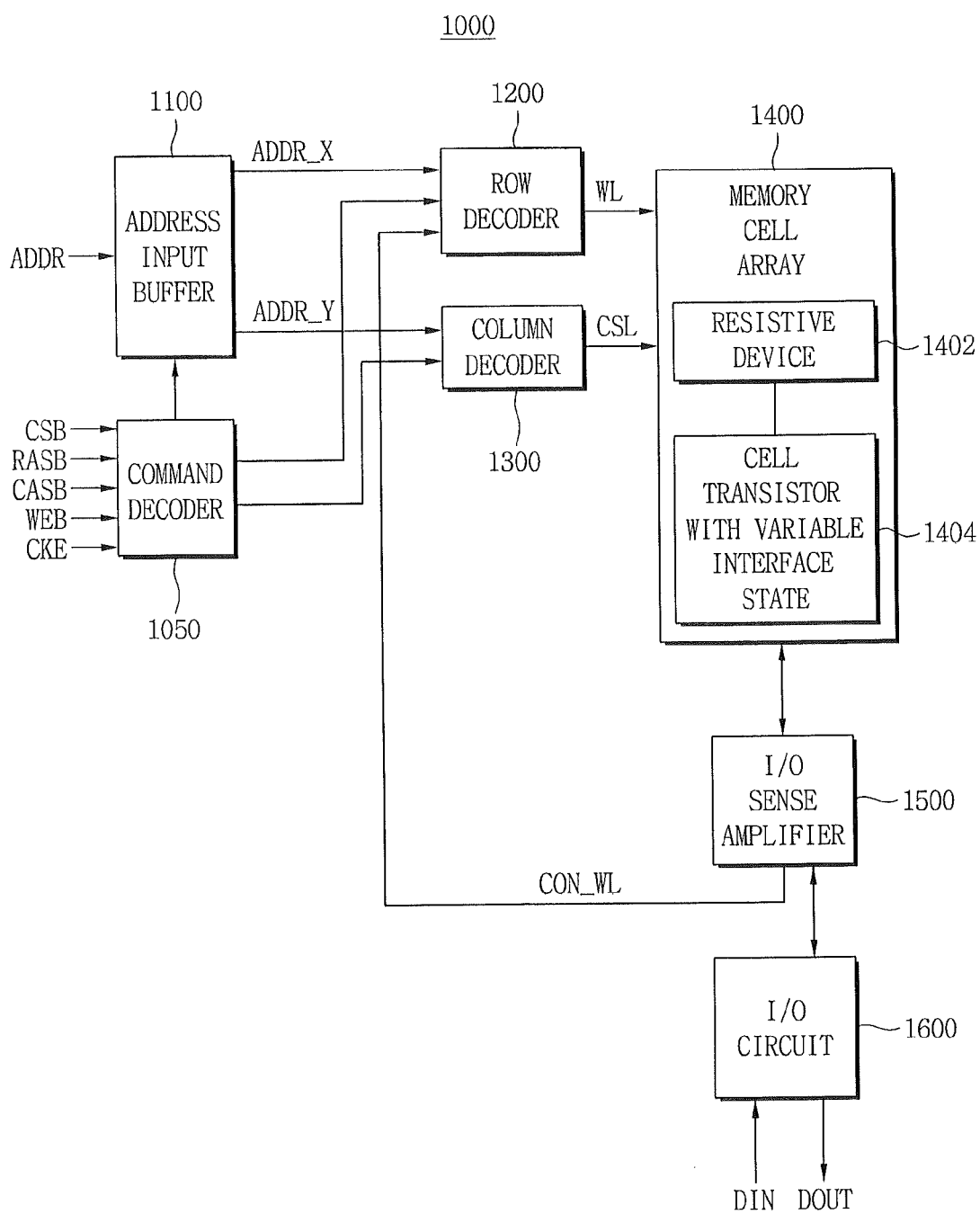
FIG. 1 is a block diagram illustrating a resistive memory device in accordance with an embodiment of the inventive concept.

Embodiments of the inventive concept are described below in sufficient detail to enable those of ordinary skill in the art to embody and practice the inventive concept. It is important to understand that the inventive concept may be embodied in many alternate forms and should not be construed as limited to the embodiments set forth herein.

Accordingly, while the inventive concept is susceptible to various modifications and may take on various alternative forms, specific embodiments thereof are shown by way of example in the drawings and will herein be described in detail. It should be understood, however, that there is no intent to limit the inventive concept to the particular forms disclosed. On the contrary, the inventive concept is to cover all modifications, equivalents, and alternatives falling within the spirit and scope of the claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. The inventive concept will now be described more fully with reference to the accompanying drawings, in which embodiments of the inventive concept are shown.

FIG. 1 is a block diagram of a resistive memory device 1000 in accordance with an embodiment of the inventive concept. Referring to FIG. 1, the resistive memory device 1000 may include a command decoder 1050, an address input buffer 1100, a row decoder 1200, a column decoder 1300, a memory cell array 1400, an input/output (I/O) sense amplifier 1500 and an I/O circuit 1600. The command decoder 1050 decodes a chip selecting signal CSB, a row address strobe signal RASB, a column address strobe signal CASB, a write enable signal WEB, and a clock enable signal CKE to generate various control signals and controls circuit blocks included in the resistive memory device 1000.

The memory cell array 1400 includes a plurality of unit memory cells including a resistive device 1402 and a cell transistor 1404, and operates in response to a word line driving signal WL and a column selecting signal CSL. The address input buffer 1100 generates a row address signal ADDR_X and a column address signal ADDR_Y based on an external address ADDR. The row decoder 1200 decodes the row address signal ADDR_X and generates the word line driving signal WL based on the decoded row address signal. Further, the row decoder 1200 may change a voltage level of the a word line driving signal WL in the test mode. The column decoder 1300 decodes the column address signal ADDR_Y and generates the column selecting signal CSL based on the decoded column address signal.

The I/O sense amplifier 1500 senses and amplifies data output from the memory cell array 1400 to generate a first data, generates a program current based on input data DIN received from an exterior, and provides the program current to the memory cell array 1400. The I/O circuit 1600 determines an output order of the first data, and performs a parallel-serial conversion to generate output data DOUT, buffers the input data DIN and provides the buffered input data to the I/O sense amplifier 1500. The resistive memory device 1000 reads out output data of the I/O sense amplifier, and adjusts interface states of cell transistors included in the memory cell array based on a voltage level of the output data in a test mode.

Resistance distributions of the resistor and a parasitic resistive device may be compensated by resistance distribution of the cell transistor. Resistance values of the cell transistors may be changed by adjusting interface states of the cell transistors.

Figure 2:
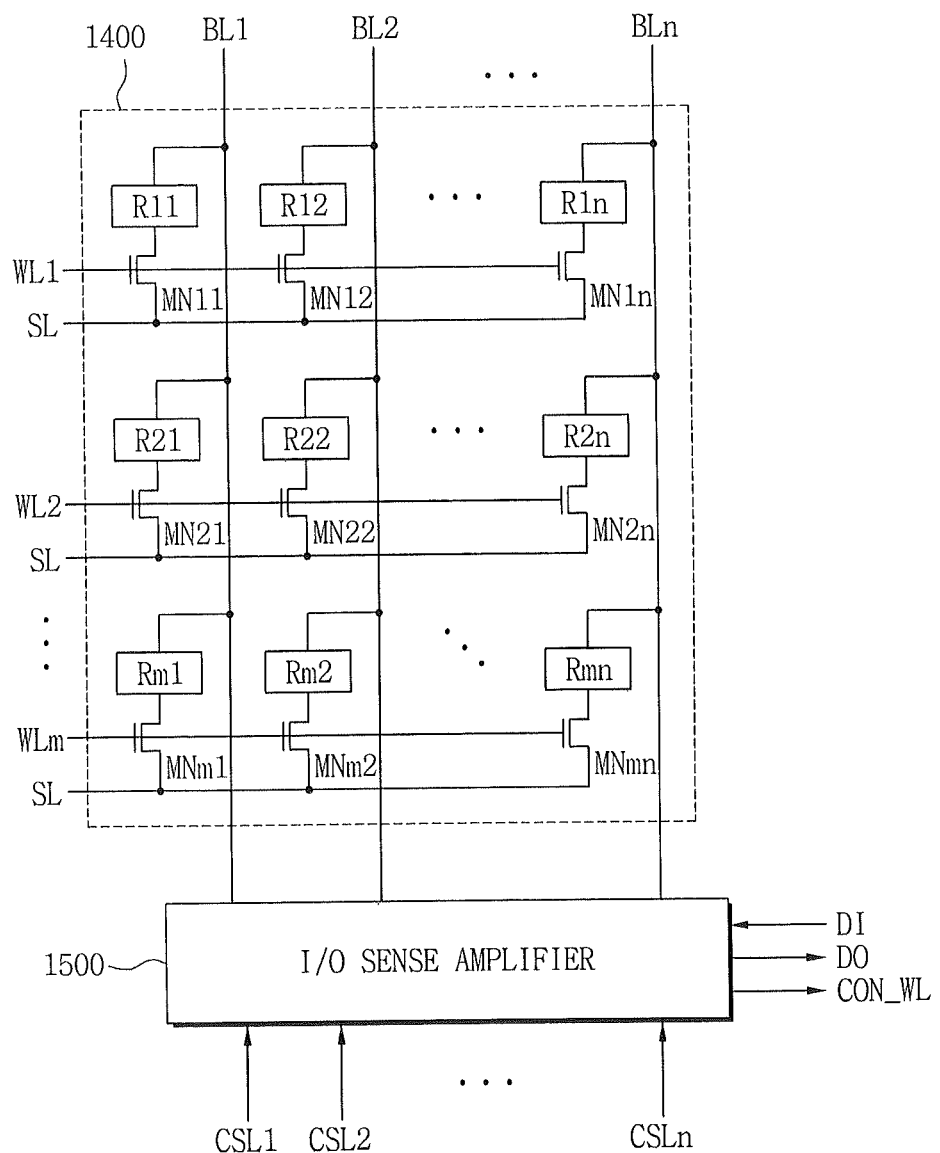
FIG. 2 is a circuit diagram illustrating an example of a memory cell array and an input/output (I/O) sense amplifier included in the resistive memory device of FIG. 1.

FIG. 2 is a circuit diagram of an example of a memory cell array 1400 and an I/O sense amplifier 1500 included in the resistive memory device 1000 of FIG. 1. Referring to FIG. 2, the memory cell array 1400 may include a plurality of word lines WL1 to WLm and a plurality of bit lines BL1 to BLn, and a unit memory cell may be provided between each of the word lines WL1 to WLm and the corresponding one of the bit lines BL1 to BLn.

The memory cell array 1400 may include cell transistors MN11 to MN1$n$ having gates connected to the word line WL1, and resistive devices R11 to R1$n$ connected between each of the cell transistors MN11 to MN1$n$ and each of the bit lines BL1 to BLn. A source of each of the cell transistors MN11 to MN1$n$ may be connected to the source line SL. Further, the memory cell array 1400 may include cell transistors MN21 to MN2$n$ having gates connected to the word line WL2, and resistive devices R21 to R2$n$ connected between each of the cell transistors MN21 to MN2$n$ and each of the bit lines BL1 to BLn. A source of each of the cell transistors MN21 to MN2$n$ may be connected to the source line SL. Further, the memory cell array 1400 may include cell transistors MNm1 to MNmn having gates connected to the word line WLm, and resistive devices Rm1 to Rmn connected between each of the cell transistors MNm1 to MNmn and the corresponding one of the bit lines BL1 to BLn. Sources of the cell transistors MNm1 to MNmn may be connected to the source line SL. The I/O sense amplifier 1500 may be connected to bit lines BL1 to BLn, and senses and amplifies data output from the memory cell array 1400 and output the amplified data, generates a program current based on input data DI received from an exterior, and provides the program current to the memory cell array 1400.

Figure 3:
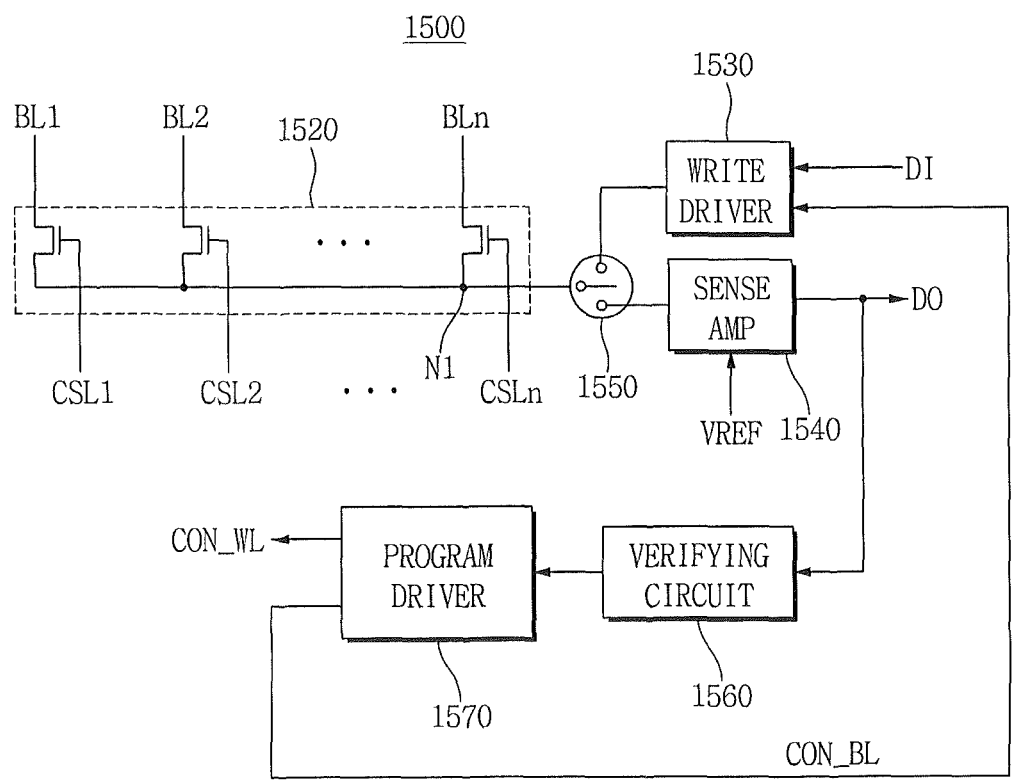
FIG. 3 is a circuit diagram illustrating an example of an I/O sense amplifier included in FIG. 2.

FIG. 3 is a circuit diagram illustrating an example of an I/O sense amplifier 1500 included in FIG. 2. The I/O sense amplifier 1500 may include a selection circuit 1520, a sense amplifier 1540, a write driver 1530, a switch 1550, a verifying circuit 1560 and a program driver 1570. The selection circuit 1520 may selectively connect the bit lines BL1-BLn to a first node N1 in response to column selection signals CSL1 to CSLn. The sense amplifier 1540 may amplify a difference between a voltage signal of the first node N1 and a reference voltage VREF, and generate first data DO. The verifying circuit 1560 compares the first data DO with a target value, determines whether the first data DO equals to the target value, and generates a first control signal in the test mode. The program driver 1570 drives a high voltage circuit based on the first control signal to generate a word line control signal CON_WL and a bit line control signal CON_BL. The write driver 1530 generates a first program current based on write data DI and provides the first program current to the first node N1 during a normal operation mode. Further, the write driver 1530 generates a second program current based on the bit line control signal CON_BL, and provides the second program current to the first node N1 in the test operation. The switch 1550 may selectively connect the first node N1 to the sense amplifier 1540 and the write driver 1530.

Figure 4:
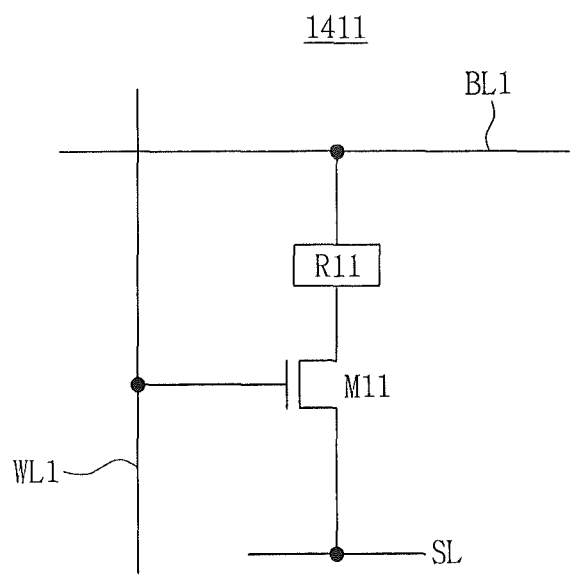
FIG. 4 is a circuit diagram illustrating an example of a unit memory cell constituting the memory cell array of FIG. 2.

FIG. 4 is a circuit diagram illustrating an example of a unit memory cell constituting the memory cell array 1400 of FIG. 2. Referring to FIG. 4, a unit memory cell 1411 may include a cell transistor M11 comprised of an NMOS transistor and a resistive device R11. The cell transistor M11 may have a gate connected to the word line WL1 and a source connected to the source line SL. The resistive device R11 is connected between the drain of the cell transistor M11 and the bit line BL1.

Figure 5:
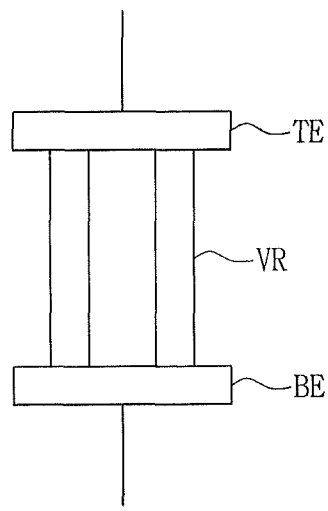
FIG. 5 is a diagram illustrating an example of a resistive device constituting the unit memory cell of FIG. 4.

FIG. 5 is a diagram illustrating an example of a resistive device R11 constituting the unit memory cell of FIG. 4. Referring to FIG. 5, the resistive device R11 includes a top electrode TE, a bottom electrode BE, and a transition metal oxide VR disposed between the top electrode TE and the bottom electrode BE. Platinum (Pt) may used as the top electrode TE and a cobalt oxide may be used as the transition metal oxide VR.

Figure 6:
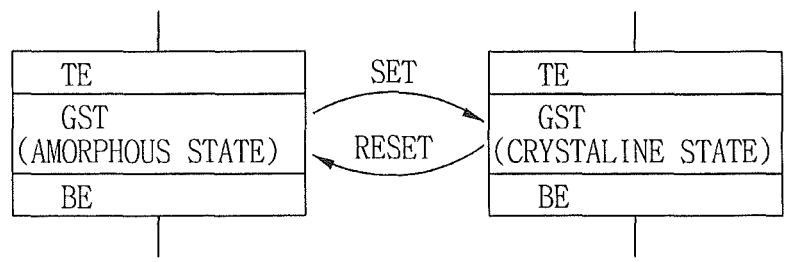
FIG. 6 is a diagram illustrating another example of a resistive device constituting the unit memory cell of FIG. 4.

FIG. 6 is a diagram illustrating another example of a resistive device R11 constituting the unit memory cell 1411 of FIG. 4. Referring to FIG. 6, the resistive device R11 includes a top electrode TE, a bottom electrode BE, and a phase change material GST disposed between the top electrode TE and the bottom electrode BE. The phase change material GST can transition between an amorphous state or a crystalline state, and a resistance value of the phase change material GST is varied according to temperature and heating time. An example of the phase change material GST is $Ge_xSb_yTe_z$.

Figure 7:
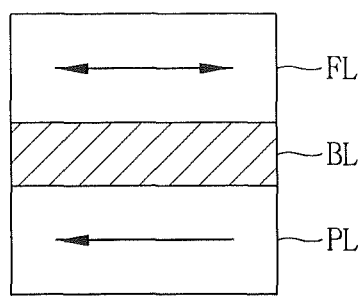
FIG. 7 is a diagram illustrating still another example of a resistive device constituting the unit memory cell of FIG. 4.

FIG. 7 is a diagram illustrating still another example of a resistive device R11 constituting the unit memory cell 1411 of FIG. 4. Referring to FIG. 7, the resistive device R11 may include a pinned layer (PL) having a predetermined pinned magnetization direction, a free layer (FL) magnetized in the direction of an externally applied magnetic field, and a tunnel barrier layer (BL) formed using an insulating film between the pinned layer PL and the free layer FL. To pin the magnetization direction of the pinned layer PL, the resistive device R11 may further include an anti-ferromagnetic layer (not shown). The resistive device R11 of FIG. 7 may be an MTJ element constituting a spin-transfer torque magneto-resistive random access memory (STT-MRAM).

To enable a write operation of the STT-MRAM, the cell transistor MN11 may be turned on by applying a logic-high voltage to the word line WL1, and a write current may be applied between the bit line BL1 and the source line SL. To enable a read operation of the STT-MRAM, the cell transistor MN11 may be turned on by applying a logic-high voltage to the word line WL1, and a read current may applied from the bit line BL1 toward a source line SL so that data stored in the MTJ cell may be determined according to a measured resistance value.

Figure 8:
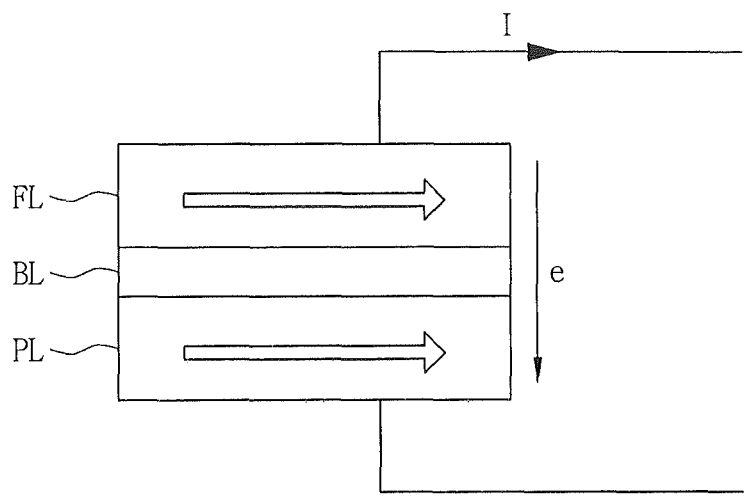
FIGS. 8 and 9 are diagrams illustrating magnetization directions of a magnetic tunnel junction (MTJ) element according to written data.
Figure 9:
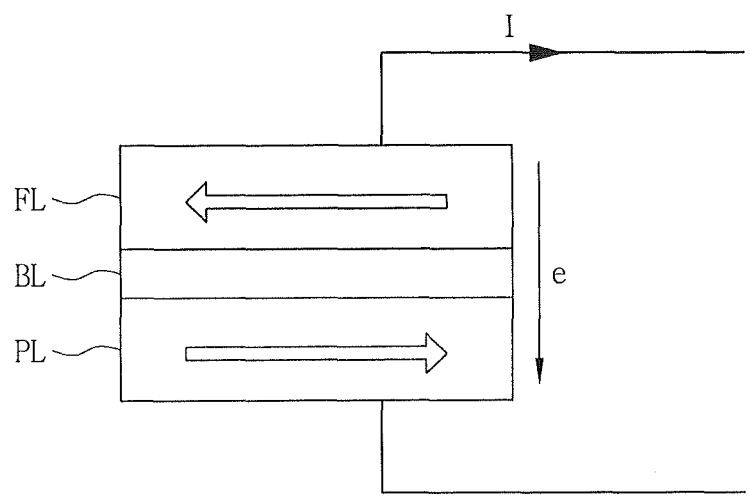

FIGS. 8 and 9 are diagrams illustrating magnetization directions of a magnetic tunnel junction (MTJ) element relative to written data, where "I" designates the direction of a read current and "e" designates the direction of electron flow. A resistance value of the MTJ element may vary according to magnetization direction of the free layer FL. When a read current I is supplied to the MTJ element, a data voltage may be output according to the resistance value of the MTJ element. Since the read current I has a much lower intensity than a write current, the magnetization direction of the free layer FL may not be shifted by the read current I. Referring to FIG. 8, in the MTJ element, the magnetization direction of the free layer FL may be parallel to the magnetization direction of the pinned layer PL. Accordingly, the MTJ element may have a low resistance value. In this case, data '0' may be read. Referring to FIG. 9, in the MTJ element, magnetization of the free layer FL may be anti-parallel to the magnetization direction of the pinned layer PL. In this case, the MTJ element may have a high resistance value. In this case, data '1' may be read. Although FIGS. 8 and 9 illustrate that each of the free layer FL and the pinned layer PL of the MTJ cell is a horizontal magnetic element, the inventive concept may provide other embodiments in which each of the free layer FL and the pinned layer PL is a vertical magnetic element.

Figure 10:
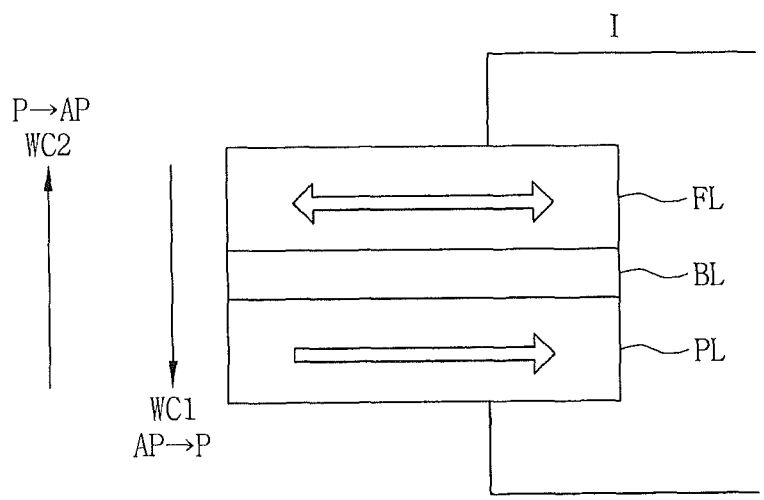
FIG. 10 is a diagram illustrating a write operation of the resistive memory device of FIG. 1 when a unit memory cell is a magnetoresistive memory cell.

FIG. 10 is a diagram illustrating a write operation of the resistive memory device of FIG. 1 when a unit memory cell is a magnetoresistive memory cell. Referring to FIG. 10, the magnetization direction of a free layer FL may be determined according to directions of write currents WC1 and WC2 flowing through an MTJ element. For example, when the first write current WC1 is applied, free electrons having the same spin direction as a pinned layer PL may apply torque to the free layer FL. Thus, the free layer FL may be magnetized from anti-parallel (AP) to parallel (P) (i.e., AP→P) to the pinned layer PL. When the second write current WC2 is applied, electrons having an opposite spin direction to the pinned layer PL may return to the free layer FL and apply torque. As a result, the free layer FL may be magnetized from parallel to anti-parallel (i.e., P→AP) to the pinned layer PL. That is, in an MTJ cell, the magnetization direction of the free layer FL may be shifted due to spin-transfer torque (STT).

Figure 11:
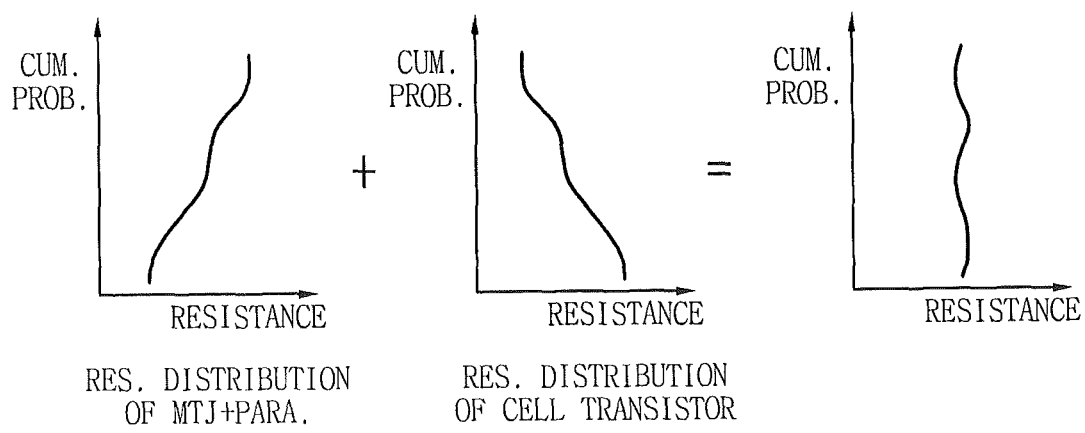
FIG. 11 is a conceptual diagram illustrating a method of compensating resistance distribution of the resistive memory device of FIG. 1.

FIG. 11 is a conceptual diagram illustrating a method of compensating resistance distribution of the resistive memory device 1000 of FIG. 1, where the y-axis label "CUM. PROB." designates "Cumulative Probability," the abbreviation "RES. DISTRIBUTION" designates "Resistance Distribution," and the abbreviation "MTJ+PARA" designates "Magnetic Tunnel Junction with Parasitic Resistor." Referring to FIG. 11, the resistive memory device according to embodiments of the inventive concept may compensate for resistance distributions of the resistive device (MTJ) and a parasitic resistor using resistance distribution of the cell transistor. The resistance distribution of the resistive memory device may be nearly "0" after the compensation is completed.

Figure 12:
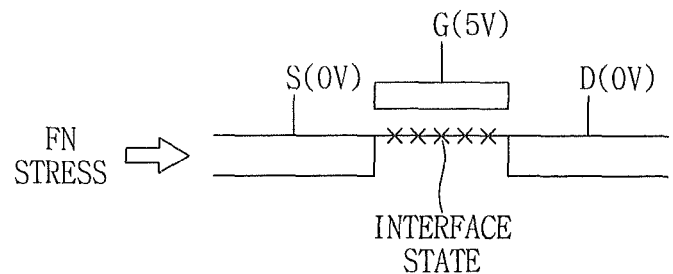
FIGS. 12 to 14 are diagrams illustrating methods of generating interface states of a cell transistor in the resistive memory device of FIG. 1.
Figure 13:
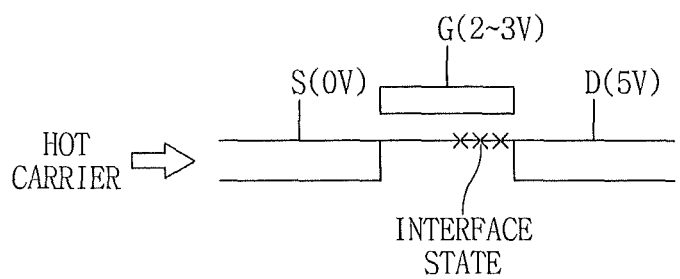
Figure 14:
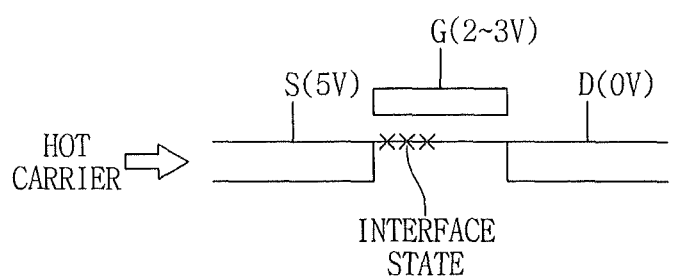

FIGS. 12 to 14 are diagrams illustrating methods of generating interface states of a cell transistor in the resistive memory device of FIG. 1. Referring to FIG. 12, the interface states of the cell transistor may be generated because of stress deterioration by Fowler-Nordheim (F-N) tunneling (i.e., Fowler-Nordheim stress (FN STRESS)). A high voltage may be applied to a gate terminal G of the cell transistor, and a ground voltage may be applied to a source terminal S and a drain terminal D of the cell transistor. In the example of FIG. 12, a voltage of 5V may be applied to the gate terminal G and the ground voltage may be applied to the source terminal S and the drain terminal D of the cell transistor.

Referring to FIG. 13, the interface states of the cell transistor may be generated by hot-carrier injection. A first high voltage may be applied to a gate terminal G of the cell transistor, the ground voltage may be applied to a source terminal S of the cell transistor, and a second high voltage may be applied to a drain terminal D of the cell transistor. The second high voltage may have higher voltage level than the first high voltage. In the example of FIG. 13, a voltage of 2 to 3V may be applied to the gate terminal G and the ground voltage may be applied to the source terminal S and a voltage of 5V may be applied to the drain terminal D of the cell transistor.

Referring to FIG. 14, the interface states of the cell transistor may be generated (or adjusted) by hot-carrier injection, and a first high voltage may be applied to a gate terminal G of the cell transistor, the ground voltage may be applied to a drain terminal D of the cell transistor, and a second high voltage having higher voltage level than the first high voltage may be applied to a source terminal S of the cell transistor. In the example of FIG. 14, a voltage of 2 to 3V may be applied to the gate terminal G and the ground voltage may be applied to the drain terminal D and a voltage of 5V may be applied to the source terminal S of the cell transistor.

Figure 15:
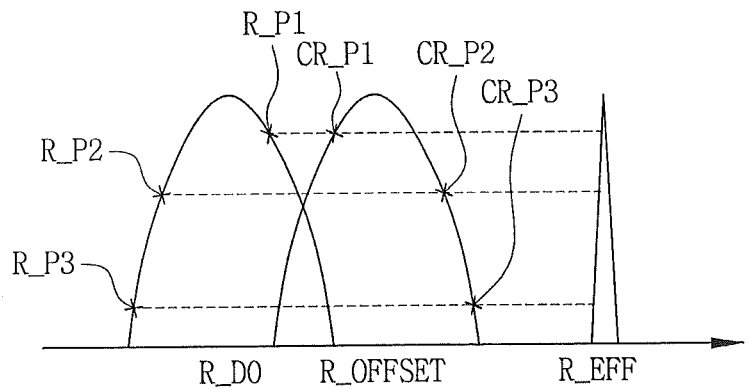
FIG. 15 is a conceptual diagram for explaining a method of compensating resistance distribution of the resistive device included in the memory cell array of FIG. 2.

FIG. 15 is a conceptual diagram for explaining a method of compensating resistance distribution of the resistive device included in the memory cell array 1400 of FIG. 2. Referring again to FIGS. 2 and 3, distances from each of the resistive devices included in the memory cell array 1400 to the sense amplifier 1540 may not be the same, and resistive distribution of the resistive devices themselves may not be the same. Therefore, the sensing margin of the sense amplifier 1540 for sensing output data may be decreased. The memory cell array 1400 of FIG. 2 may decrease the resistance distribution of each of the resistive memory cells included in the memory cell array 1400 sensed in an input terminal of the sense amplifier 1540 by adjusting interface states of the cell transistors.

In FIG. 15, R_D0 denotes resistance distribution of the resistor, and R_OFFSET denotes resistance distribution of the compensation resistor for cancelling resistance deviation between the resistors. Further, R_EFF denotes an effective resistance value measured at the input terminal of the sense amplifier 1540 after the resistance deviation between the resistors is cancelled. In FIG. 15, it may be noted that the distribution of resistance R_P1 is cancelled by resistance CR_P1 of a cell transistor, the distribution of resistance R_P2 is cancelled by resistance CR_P2 of a cell transistor, and the distribution of a resistor R_P3 is cancelled by resistance CR_P3 of a cell transistor. Referring to FIG. 15, distribution of effective resistance of the resistive devices included in the memory cell array 1400 of the resistive memory device 1000 is near "0".

Figure 16:
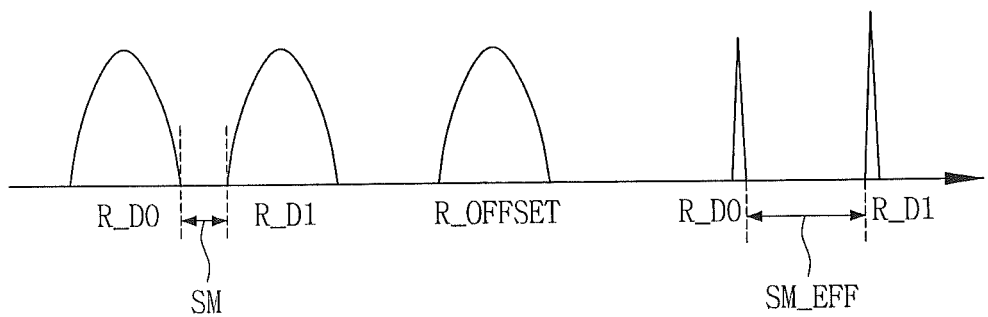
FIG. 16 is a diagram illustrating a sensing margin of a resistive device included in the memory cell array of FIG. 2 before and after resistance distribution is compensated.

FIG. 16 is a diagram illustrating a sensing margin (SM) of a resistive device included in the memory cell array 1400 of FIG. 2 before and after resistance distribution is compensated. Referring to FIG. 16, it may be noted that the sensing margin, that is a resistance value between a resistance value R_D0 of data "0" and a resistance value R_D1 of data "1", is increased to an effective sensing margin SM_EFF when the compensation is done using resistance R_OFFSET of a cell transistor.

Figure 17:
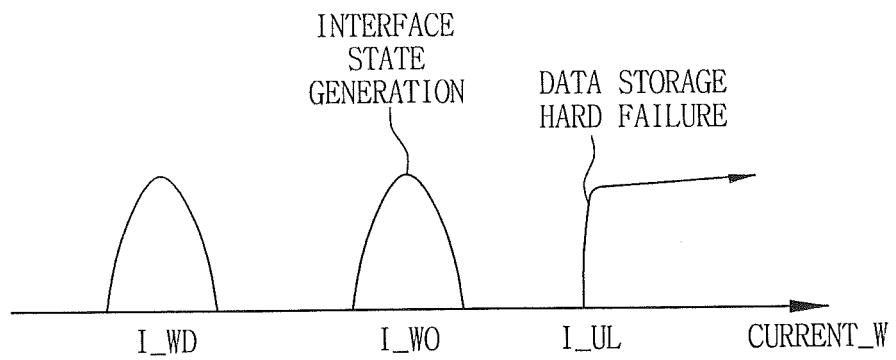
FIG. 17 is a diagram illustrating range of a magnitude of a write current for programming a resistive device to compensate distribution of the resistive device included in the memory cell array of FIG. 2.

FIG. 17 is a diagram illustrating range of a magnitude of a write current for programming a resistive device to compensate distribution of the resistive device included in the memory cell array of FIG. 2. In FIG. 17, I_WD denotes a write current for programming a resistive device in a normal operating mode, and I_WO denotes a write current for providing stress to the cell transistor, which causes interface state generation (INTERFACE STATE GENERATION). Referring to FIG. 17, the lower limit of a magnitude of the write current for providing the stress to the cell transistor may be determined as a current value that is not affected by a write current of the resistive device. The upper limit I_UL of a magnitude of the write current for providing the stress to the cell transistor may be determined as a current value that does not break down the resistive device, but higher values of write current can cause data storage hard failures (DSHF).

Figure 18:
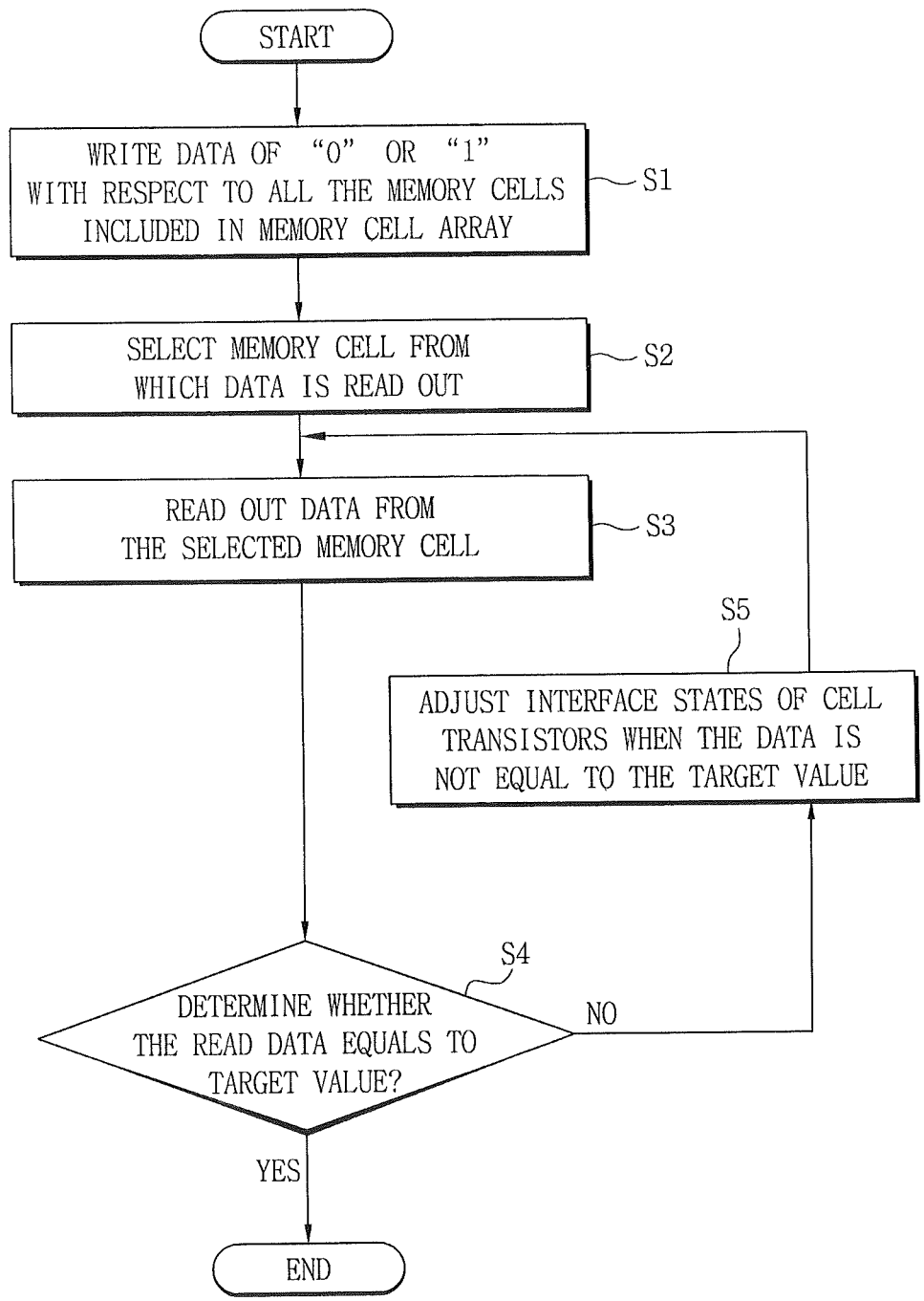
FIG. 18 is a flowchart illustrating a method of compensating resistance distribution of a resistive memory device, in accordance with an embodiment of the inventive concept.

FIG. 18 is a flowchart illustrating a method of compensating resistance distribution of a resistive memory device, in accordance with an embodiment of the inventive concept. The resistive memory device may include a plurality of resistive devices and a plurality of cell transistors serially connected to each of the resistive devices. Referring to FIG. 18, the method of compensating resistance distribution of a resistive device may include the following operations:

(1) writing data of "0" or "1" with respect to all the memory cells included in a memory cell array (S1);
(2) selecting a memory cell from which data is read out (S2);
(3) reading out data from the selected memory cell (S3);
(4) determining whether the read data equals to a target value (S4); and
(5) ending a process when the data is equal to the target value, adjusting interface states of cell transistors when the data is not equal to the target value, and executing the operation 3 (S3) (S5). The operation of adjusting interface states of the cell transistors may be expressed as an offset write operation in this specification.

Figure 19:
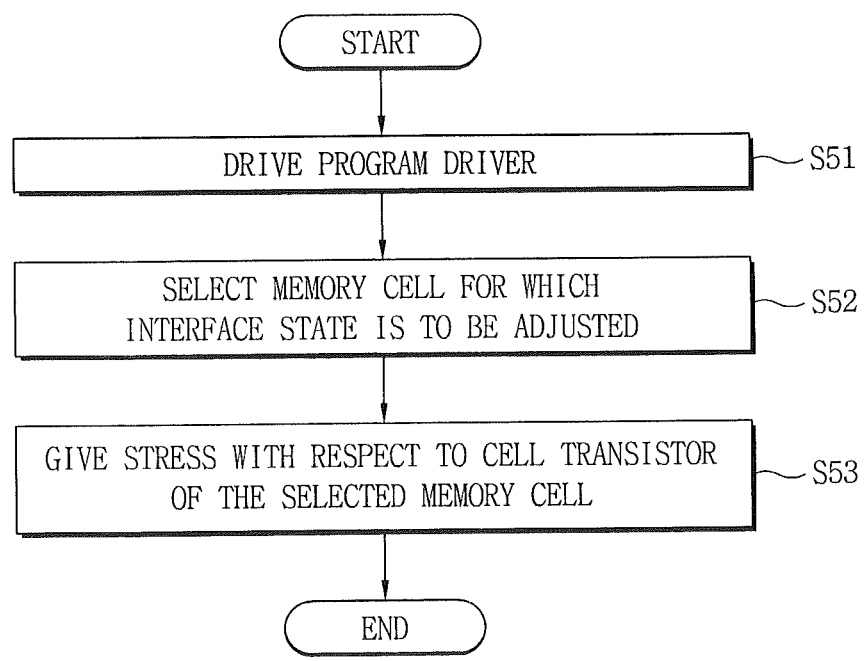
FIG. 19 is a flowchart illustrating a method of adjusting the interface states of cell transistors in the method of compensating resistance distribution of the resistive memory device of FIG. 18.

FIG. 19 is a flowchart illustrating a method of adjusting the interface states of cell transistors in the method of compensating resistance distribution of the resistive memory device of FIG. 18. Referring to FIG. 19, the method of adjusting the interface states of cell transistors may include the following operations:

(1) driving a program driver (S51);
(2) selecting a memory cell for which interface state is to be adjusted (S52);
(3) giving stress with respect to a cell transistor of the selected memory cell (S53).

Figure 20:
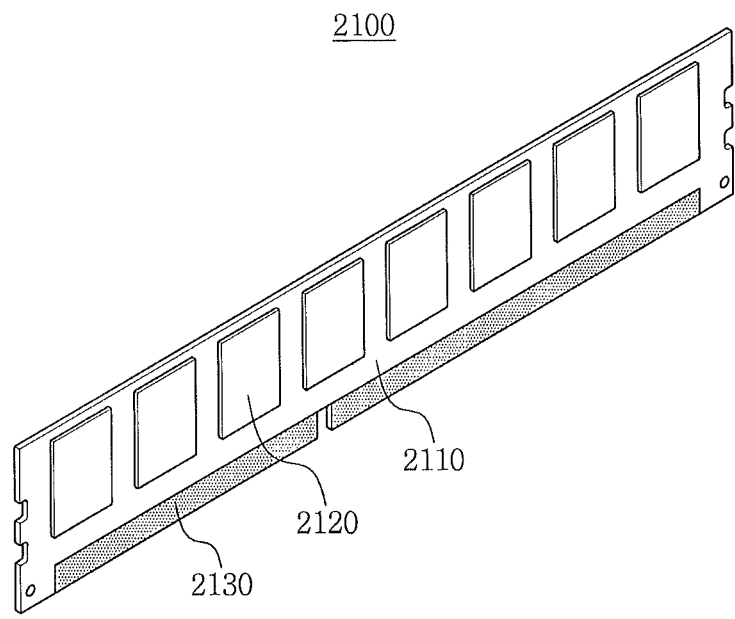
FIG. 20 is a diagram illustrating a memory module including resistive memory devices according to embodiments of the inventive concept.

FIG. 20 is a diagram illustrating a memory module 2100 including resistive memory devices according to embodiments of the inventive concept. Referring to FIG. 20, the memory module 2100 may include a printed circuit board (PCB) 2110, a plurality of MRAM chips 2120, and a connector 2130. The plurality of MRAM chips 2120 may be bonded to top and bottom surfaces of the PCB 2110. The connector 2130 may be electrically connected to the plurality of MRAM chips 2120 through conductive lines (not shown). Also, the connector 2130 may be connected to a slot of an external host.

Figure 21:
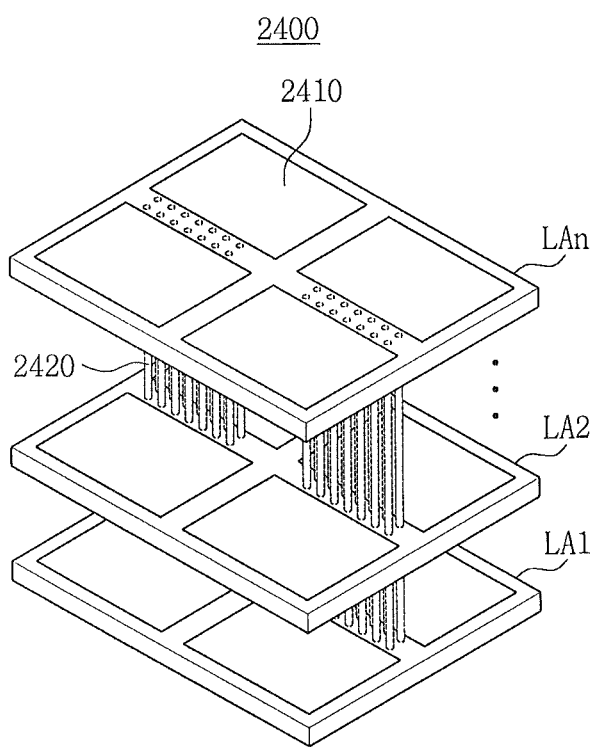
FIG. 21 is a simplified perspective view of a semiconductor device having a stack structure including a resistive memory device according to embodiments of the inventive concept.

FIG. 21 is a simplified perspective view of a semiconductor device having a stack structure including a resistive memory device according to embodiments of the inventive concept. In the memory module 2100 of FIG. 20, each of the memory chips may include a plurality of semiconductor layers LA1 to LAn shown in FIG. 21. In the stack semiconductor device 2400, the plurality of stacked semiconductor layers LA1 to LAn may be connected to one another through through-silicon vias (TSVs) 2420. Each of the semiconductor layers LA1 to LAn may include cell arrays 2410 including STT-MRAM cells.

Figure 22:
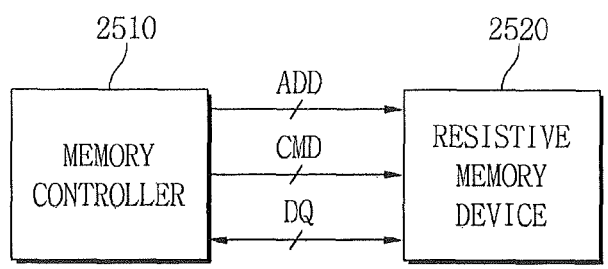
FIG. 22 is a block diagram of an example of a memory system including a resistive memory device according to embodiments of the inventive concept.

FIG. 22 is a block diagram of an example of a memory system 2500 including a resistive memory device according to embodiments of the inventive concept. Referring to FIG. 22, the memory system 2500 may include a memory controller 2510 and a resistive memory device 2520. The memory controller 2510 may generate an address signal ADD and a command CMD, and provide the address signal ADD and the command CMD to the resistive memory device 2520 through buses. Data DQ may be transmitted from the memory controller 2510 to the resistive memory device 2520 through the buses, or transmitted from the resistive memory device 2520 to the memory controller 2510 through the buses. The resistive memory device 2520 may be a resistive memory device 1000 according to an embodiment of the inventive concept, and may compensate for resistance distribution by adjusting interface states of the cell transistors.

Figure 23:
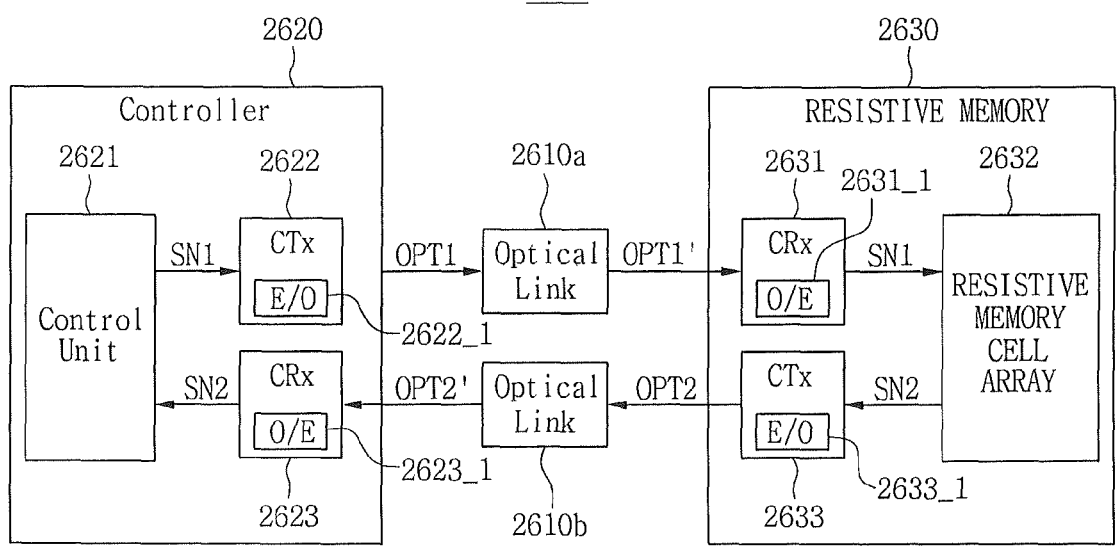
FIG. 23 is a block diagram of an example of a memory system including a resistive memory device and an optical link according to an embodiment of the inventive concept.

FIG. 23 is a block diagram of an example of a memory system 2600 including a resistive memory device and an optical link according to an embodiment of the inventive concept. Referring to FIG. 23, the memory system 2600 may include a controller 2620, a resistive memory device 2630, and a plurality of optical links 2610a and 2610b configured to interconnect the controller 2620 and the resistive memory device 2630. The controller 2620 may include a control unit 2621, a first control transmitter (CTx) 2622, and a first control receiver (CRx) 2623. The control unit 2621 may transmit a control signal SN1 to the first transmitter 2622. The first transmitter 2622 may include a first optical modulator 2622_1, which performs an electrical-to-optical (E/O) signal conversion by converting the control signal SN1, which is an electric signal, into a first optical transmission signal OPT1, and transmit the first optical transmission signal OPT1 to the optical link 2610a. The first control receiver (CRx) 2623 may include a first optical demodulator 2623_1, which performs an optical-to-electrical (O/E) signal conversion by converting a second optical receiving signal OPT2' received from the optical link 2610b into a data signal SN2, which is an electric signal, and transmit the data signal SN2 to the control unit 2621.

The resistive memory device 2630 may include a second control receiver (CRx) 2631, a resistive memory cell array 2632, and a second control transmitter (CTx) 2633. The second control receiver 2631 may include a second optical modulator 2631_1, which performs an optical-to-electrical (O/E) signal conversion by converting a first optical receiving signal OPT1' received from the optical link 2610a into the control signal SN1, which is the electric signal, and transmit the control signal SN1 to the resistive memory cell array 2632. In the resistive memory cell array 2632, data may be written under the control of the control signal SN1, or the data signal SN2 output by the resistive memory cell array 2632 may be transmitted to the second transmitter 2633. The second control transmitter 2633 may include a second optical modulator 2633_1, which performs an electrical-to-optical (O/E) signal conversion by converting the data signal SN2, which is the electric signal received from the resistive memory cell array 2632, into a second optical data signal OPT2, and transmit the second optical data signal OPT2 to the optical link 2610b.

Figure 24:
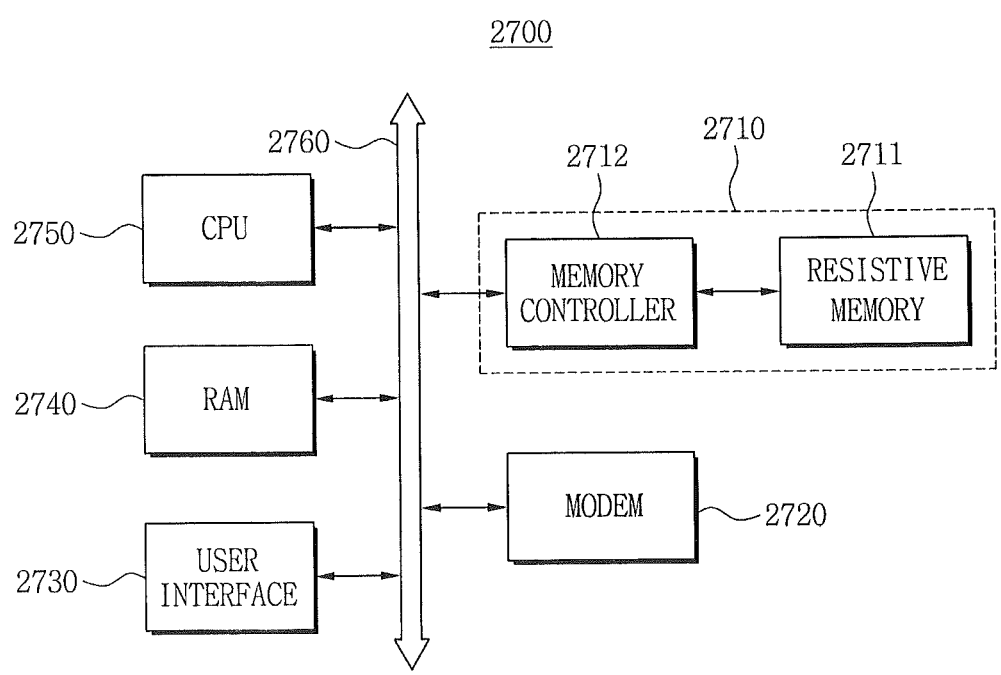
FIG. 24 is a block diagram of an example of an information processing system including a resistive memory device according to an embodiment of the inventive concept.

FIG. 24 is a block diagram of an example of an information processing system 2700 including a resistive memory device according to an embodiment of the inventive concept. Referring to FIG. 24, a resistive memory device 2711 may be mounted in a computer system. The information processing system 2700 may include a memory system 2710, a modem 2720, a central processing unit (CPU) 2750, a RAM 2740, and a user interface 2730, which may be electrically connected to a system bus 2760.

The memory system 2710 may include the resistive memory device 2711 and a memory controller 2712. Data processed by the CPU 2750 or externally input data may be stored in the resistive memory device 2711. A semiconductor memory device including STT-MRAM cells may be applied to at least one of the resistive memory device 2711 and the RAM 2740. That is, the semiconductor memory device including STT-MRAM cells may be applied to the resistive memory device 2711 configured to store a large capacity of data required for the information processing system 2700, or the RAM 2740 configured to store data (i.e., system data) that needs to be rapidly accessed. Although not shown in FIG. 24, it would be apparent to those of ordinary skill in the art that an application chipset, a camera image processor (CIP), and an input/output (I/O) device may be further provided in the information processing system 2700.

Among resistive memory devices, an STT-MRAM may be an advanced memory that may satisfy low-cost large-capacity characteristics of a dynamic RAM (DRAM), operation speed of a static RAM (SRAM), and non-volatile characteristics of a flash memory. Accordingly, while a conventional system requiring an additional cache memory with high processing speed and an additional mass storage unit (e.g., a RAM) configured to store a large capacity of data, the cache memory and the mass storage unit may be replaced by an MRAM device according to an embodiment of the inventive concept. That is, since a memory device including an MRAM may rapidly store a large capacity of data, an information processing system may be configured more simply than in the conventional art.

The resistive memory device according to embodiments of the inventive concepts is able to compensate for resistance distribution of resistive devices and parasitic resistors of lines by adjusting interface states of cell transistors included in the memory cell array and increase sensing margin of data.

The inventive concept may be applied to a semiconductor device, particularly, a resistive memory device and a memory system including the same.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A memory system, comprising:
a memory device having an array of nonvolatile memory cells therein electrically coupled to a plurality of bit lines and a plurality of word lines, said nonvolatile memory cells comprising respective nonvolatile resistive devices electrically coupled in series with corresponding cell transistors; and
a controller coupled to said memory device, said controller configured to drive said memory device with signals that support dual programming of the nonvolatile resistive devices and interface states within the cell transistors during operations to write data into said memory device.

2. The memory system of claim 1, wherein the operations to write data into said memory device include writing equivalent data into first and second nonvolatile memory cells by programming first and second cell transistors within the first and second nonvolatile memory cells, respectively, with unequal levels of interface states.

3. The memory system of claim 2, wherein writing equivalent data into first and second nonvolatile memory cells comprises programming first and second nonvolatile resistive devices within the first and second nonvolatile memory cells, respectively, in advance of said programming first and second cell transistors with the unequal levels of interface states.

4. The memory system of claim 3, wherein said programming first and second nonvolatile resistive devices is followed by determining whether the first and second nonvolatile resistive devices have been programmed to equivalent target values.

5. The memory system of claim 2, wherein the first and second cell transistors are MOS transistors; and wherein the first and second cell transistors are programmed with the unequal levels of interface states via at least one of hot-carrier injection and Fowler-Nordheim tunneling.

6. A resistive memory device, comprising:
a memory cell array including a plurality of unit memory cells, and operating in response to a word line driving signal and a column selecting signal, each of the unit memory cells including a resistive device and a cell transistor connected in series; and
an input/output sense amplifier configured to sense and amplify data output from the memory cell array to output the amplified data, generate a program current based on input data received from an exterior, and provide the program current to the memory cell array,
wherein the memory device is configured to read out output data of the input/output sense amplifier, and adjust interface states of cell transistors included in the memory cell array based on a voltage level of the output data in a test mode.

7. The device of claim 6, wherein first and second resistance distributions of the resistor and a parasitic resistive device, respectively, are configured to be compensated by resistance distribution of the cell transistor.

8. The device of claim 6, wherein resistance values of the cell transistors are configured to be changed by adjusting the interface states of the cell transistors.

9. The device of claim 6, wherein the interface states are configured to be generated because of stress-related degradation by Fowler-Nordheim (F-N) tunneling.

10. The device of claim 9, wherein a high voltage is applied to each gate terminal of the cell transistors, and a ground voltage is applied to each source terminal and each drain terminal of the cell transistors.

11. The device of claim 6, wherein the interface states are configured to be generated by hot-carrier injection.

12. The device of claim 11, wherein a first high voltage is applied to each gate terminal of the cell transistors, a ground voltage is applied to each source terminal of the cell transistors, and a second high voltage is applied to each drain terminal of the cell transistors, the second high voltage having a higher voltage than the first high voltage.

13. The device of claim 11, wherein a first high voltage is applied to each gate terminal of the cell transistors, a ground voltage is applied to each drain terminal of the cell transistors, and a second high voltage is applied to each source terminal of the cell transistors, the second high voltage having a higher voltage than the first high voltage.

14. The device of claim 6, wherein the resistive device comprises:
a top electrode;
a bottom electrode; and a transition metal oxide disposed between the top electrode and the bottom electrode.

15. The device of claim 6, wherein the resistive device comprises:
    a top electrode;
    a bottom electrode; and
    a phase-change material disposed between the top electrode and the bottom electrode.

16. The device of claim 6, wherein the resistive device comprises:
    a free layer comprised of a first ferromagnetic material;
    a pinned layer comprised of a second ferromagnetic material; and
    a tunnel barrier layer disposed between the free layer and the pinned layer.

17. The device of claim 6, further comprising:
    an address input buffer configured to generate a row address signal and a column address signal based on an external address;
    a row decoder configured to decode the row address signal and generate the word line driving signal based on the decoded row address signal; and
    a column decoder configured to decode the column address signal and generate the column selecting signal based on the decoded column address signal.

18. A method of programming a nonvolatile memory device, comprising:
    programming first and second nonvolatile memory elements within first and second nonvolatile memory cells, respectively, with equivalent data; then
    reading data from the first and second nonvolatile memory cells to verify whether the first and second nonvolatile memory elements have been programmed to equivalent target values; and then
    programming first and second cell transistors within the first and second nonvolatile memory cells, respectively, with unequal levels of interface states.

19. The method of claim 18, wherein said programming first and second cell transistors is performed in response to determining that the first and second nonvolatile memory elements have been programmed to unequal target values.

20. The method of claim 18, wherein said programming first and second cell transistors comprises programming the first and second cell transistors so that a combined series resistance of the first nonvolatile memory element and the first cell transistor is about equal to a combined series resistance of the second nonvolatile memory element and the second cell transistor.

* * * * *